(12) United States Patent
Nakazawa (10) Patent No.: US 10,796,757 B1
(45) Date of Patent: Oct. 6, 2020

(54) SEMICONDUCTOR STORAGE DEVICE (71) Applicant: TOSHIBA MEMORY CORPORATION, Tokyo (JP)

(72) Inventor: Shingo Nakazawa, Kamakura Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/557,818

(22) Filed: Aug. 30, 2019

(30) Foreign Application Priority Data

Mar. 11, 2019 (JP) .................................. 2019-043401

(51) Int. Cl.
| | | |
|---|---|---|
| *G11C 13/00* | (2006.01) | |
| *H01L 23/528* | (2006.01) | |
| *H01L 27/24* | (2006.01) | |
| *H01L 45/00* | (2006.01) | |

(52) U.S. Cl.
CPC ........ *G11C 13/0004* (2013.01); *G11C 13/004* (2013.01); *G11C 13/0069* (2013.01); *H01L 23/528* (2013.01); *H01L 27/2463* (2013.01); *H01L 45/06* (2013.01); *H01L 45/1233* (2013.01); *H01L 45/144* (2013.01); *G11C 13/0026* (2013.01); *G11C 13/0028* (2013.01); *G11C 13/0038* (2013.01); *G11C 2013/005* (2013.01); *G11C 2013/009* (2013.01)

(58) Field of Classification Search
CPC .......................... G11C 11/1675; G11C 13/0069
USPC .................................................. 365/163, 158
See application file for complete search history.

(56) References Cited

U.S. PATENT DOCUMENTS

| | | | |
|---|---|---|---|
| 7,778,066 B2 | 8/2010 | Horii et al. | |
| 7,889,537 B2* | 2/2011 | Edahiro | G11C 13/0007 365/100 |
| 7,978,499 B2* | 7/2011 | Hosono | G11C 13/0004 365/148 |
| 8,456,940 B2* | 6/2013 | Hanzawa | G11C 13/0004 365/163 |
| 8,730,745 B2* | 5/2014 | Sasaki | G11C 5/025 365/148 |
| 8,773,888 B2* | 7/2014 | Chang | G11C 11/5685 365/148 |

(Continued)

FOREIGN PATENT DOCUMENTS

| | | |
|---|---|---|
| CN | 101727979 A | 6/2010 |
| JP | 2011018838 A | 1/2011 |
| TW | 201428750 A | 7/2014 |

*Primary Examiner* — Michael T Tran
(74) *Attorney, Agent, or Firm* — Kim & Stewart LLP (57) ABSTRACT

A semiconductor storage device includes interconnections in a first layer and a second layer, a first memory cell between a first and a second interconnection, and a dummy memory cell between the first interconnection and a third interconnection. A controller applies a first voltage of a first polarity to the first interconnection and a second voltage of a second polarity opposite the first polarity to the second interconnection at a first time. The controller applies a third voltage at a second time after the first time to the first interconnection. The third voltage having a smaller magnitude smaller than first voltage. The controller applies a fourth voltage to the third interconnection at the second time. The fourth voltage has a magnitude larger than the third voltage but smaller than the first voltage.

19 Claims, 7 Drawing Sheets

(56) References Cited

U.S. PATENT DOCUMENTS

| | | | | |
|---|---|---|---|---|
| 8,861,253 | B2* | 10/2014 | Chang | G11C 11/5685 |
| | | | | 365/148 |
| 9,029,825 | B2* | 5/2015 | Tada | G11C 13/0007 |
| | | | | 257/4 |
| 10,068,642 | B1* | 9/2018 | Suzuki | H01L 45/085 |
| 10,510,419 | B1* | 12/2019 | Yamada | G11C 16/3427 |
| 2002/0080644 | A1* | 6/2002 | Ito | G11C 11/1655 |
| | | | | 365/158 |
| 2003/0223283 | A1* | 12/2003 | Kunikiyo | G11C 11/1655 |
| | | | | 365/200 |
| 2004/0062074 | A1* | 4/2004 | Ooishi | G11C 11/15 |
| | | | | 365/158 |
| 2006/0023497 | A1* | 2/2006 | Kawazoe | G11C 13/004 |
| | | | | 365/158 |
| 2006/0158948 | A1* | 7/2006 | Fuji | G11C 13/0004 |
| | | | | 365/222 |
| 2006/0209585 | A1* | 9/2006 | Tanizaki | G11C 13/0004 |
| | | | | 365/148 |
| 2008/0002456 | A1* | 1/2008 | Toda | G11C 13/0004 |
| | | | | 365/148 |
| 2012/0230082 | A1* | 9/2012 | Maejima | G11C 13/0002 |
| | | | | 365/148 |
| 2019/0043594 | A1* | 2/2019 | Zhao | G11C 11/5628 |
| 2019/0267082 | A1* | 8/2019 | Parkinson | G11C 11/1657 |
| 2019/0325934 | A1* | 10/2019 | Matsubara | G11C 11/2295 |
| 2020/0027491 | A1* | 1/2020 | Fong | G11C 11/1675 |
| 2020/0058341 | A1* | 2/2020 | Villa | G11C 11/221 |

* cited by examiner

SEMICONDUCTOR STORAGE DEVICE

CROSS-REFERENCE TO RELATED APPLICATION

This application is based upon and claims the benefit of priority from Japanese Patent Application No. 2019-043401, filed Mar. 11, 2019, the entire contents of which are incorporated herein by reference.

FIELD

Embodiments described herein relate generally to semiconductor storage devices.

BACKGROUND

A semiconductor storage device including a first interconnection, a first variable resistance element connected to the first interconnection, a first nonlinear element connected to the first variable resistance element, and a second interconnection connected to the first nonlinear element is known.

DETAILED DESCRIPTION

In general, according to one embodiment, a semiconductor storage device includes: a first plurality of interconnections in a first layer, a second plurality of interconnections in a second layer, and a first plurality of memory cells connected between the first and second pluralities of interconnections. The plurality of memory cells includes a first memory cell and a dummy memory cell. The first memory cell has a first variable resistance element connected to a first interconnection in the first plurality and a first nonlinear element. The first nonlinear element is connected to a second interconnection in the second plurality. The dummy memory cell has a second variable resistance element connected to the first interconnection and a second nonlinear element. The second nonlinear element is connected to a third interconnection in the second plurality. A controller is configured to: apply a first voltage of a first polarity to the first interconnection and a second voltage of a second polarity opposite the first polarity to the second interconnection at a first time point during a reading or writing operation on the plurality of memory cells; apply a third voltage at a second time point after the first time point during the reading or writing operation to the first interconnection, the third voltage having a magnitude smaller than a magnitude of the first voltage; and apply a fourth voltage to the third interconnection at the second time point during the reading or writing operation, the fourth voltage having a magnitude that is larger than the magnitude of the third voltage but smaller than the magnitude of the first voltage.

Next, a semiconductor storage device according to an example embodiment will be described with reference to the drawings. The following example embodiment is only one implementation and the present disclosure is limited to this example embodiment. Moreover, the drawings are schematic and some elements may be omitted for the sake of explanation.

Furthermore, in the present disclosure, one direction parallel to the upper surface of a substrate is referred to as an X direction, another direction parallel to the upper surface of the substrate but perpendicular to the X direction is referred to as a Y direction, and a direction orthogonal to the upper surface of the substrate is referred to as a Z direction.

In addition, in the present disclosure, a direction along a surface is sometimes referred to as a first direction, a direction intersecting with the first direction but parallel the surface is sometimes referred to as a second direction, and a direction intersecting with the predetermined surface is sometimes referred to as a third direction. Each of these first direction, second direction, and third direction may or may not correspond to any one of the X direction, the Y direction, and the Z direction.

In the present disclosure, expressions such as "above," "upper," "below," and "lower" are sometimes used. In general, these terms reference relative positions along direction orthogonal to a main surface of the substrate. For instance, a lower surface or a lower end of an element refer to a surface or an end of this element which is closer to the substrate. Similarly, for an upper surface and an upper end of an element, the upper surface and the upper end refer to a surface or an end of this element which is farther away from the substrate. Furthermore, any surface intersecting with the second direction or the third direction may be referred to as a "side wall".

In addition, in the present disclosure, when a first element is stated to be "electrically connected" or "connected" to a second element, the first element may be directly connected to the second element or the first element may be connected to the second element via an interconnection, a semiconductor component, a transistor, a wiring, or the like. For example, when three transistors are connected in series, even when the second transistor is in an OFF state, the first transistor is to be considered "electrically connected" to the third transistor.

Moreover, in the present disclosure, when a first element is stated to be "electrically insulated" or "insulated" from a second element, this is assumed to mean, for instance, that an insulating film or material is provided between the first element and the second element and there is no connector, interconnection, wiring or the like which electrically connects the first element and the second element.

First Embodiment

[Configuration]

Figure 1:
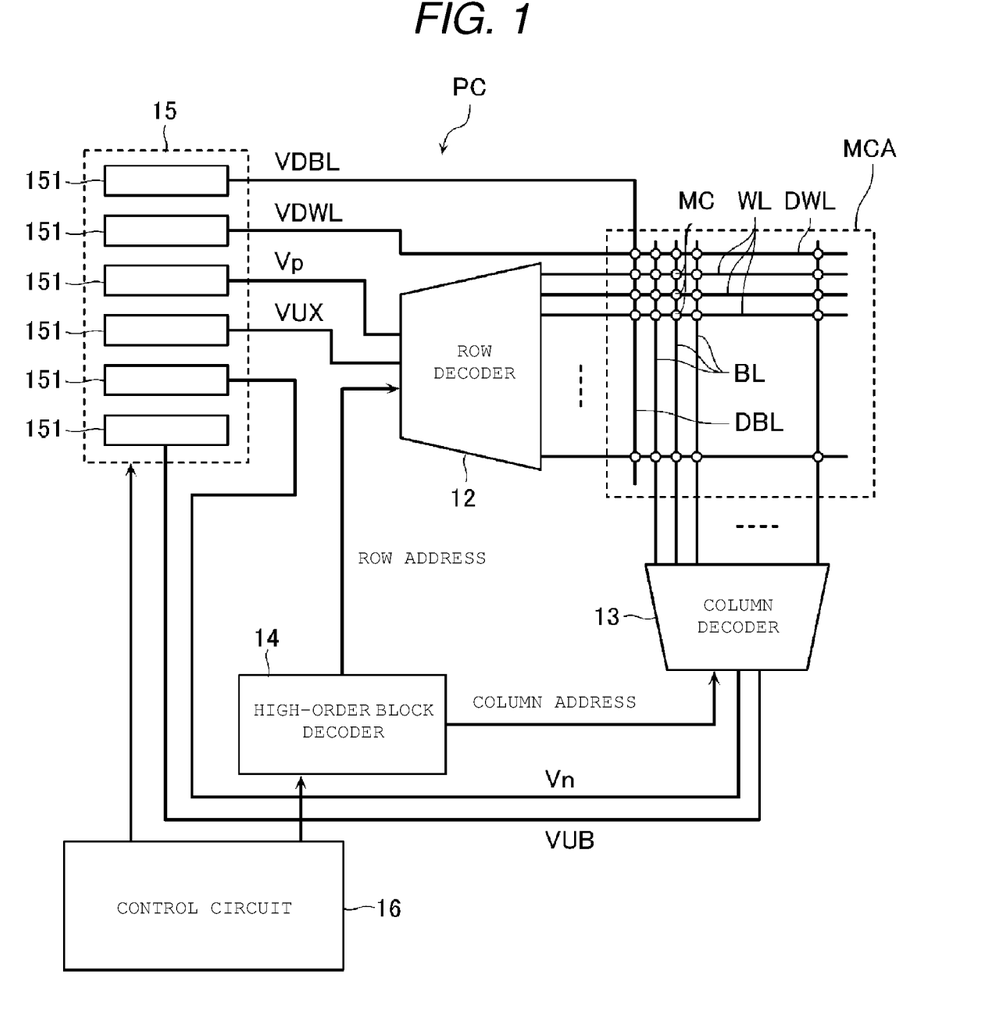
FIG. 1 is a schematic block diagram depicting aspects of a semiconductor storage device according to a first embodiment.

As depicted in FIG. 1, the semiconductor storage device according to the first embodiment includes a memory cell array MCA and a peripheral circuit PC (also referred to as a controller) that controls the memory cell array MCA.

Figure 2:
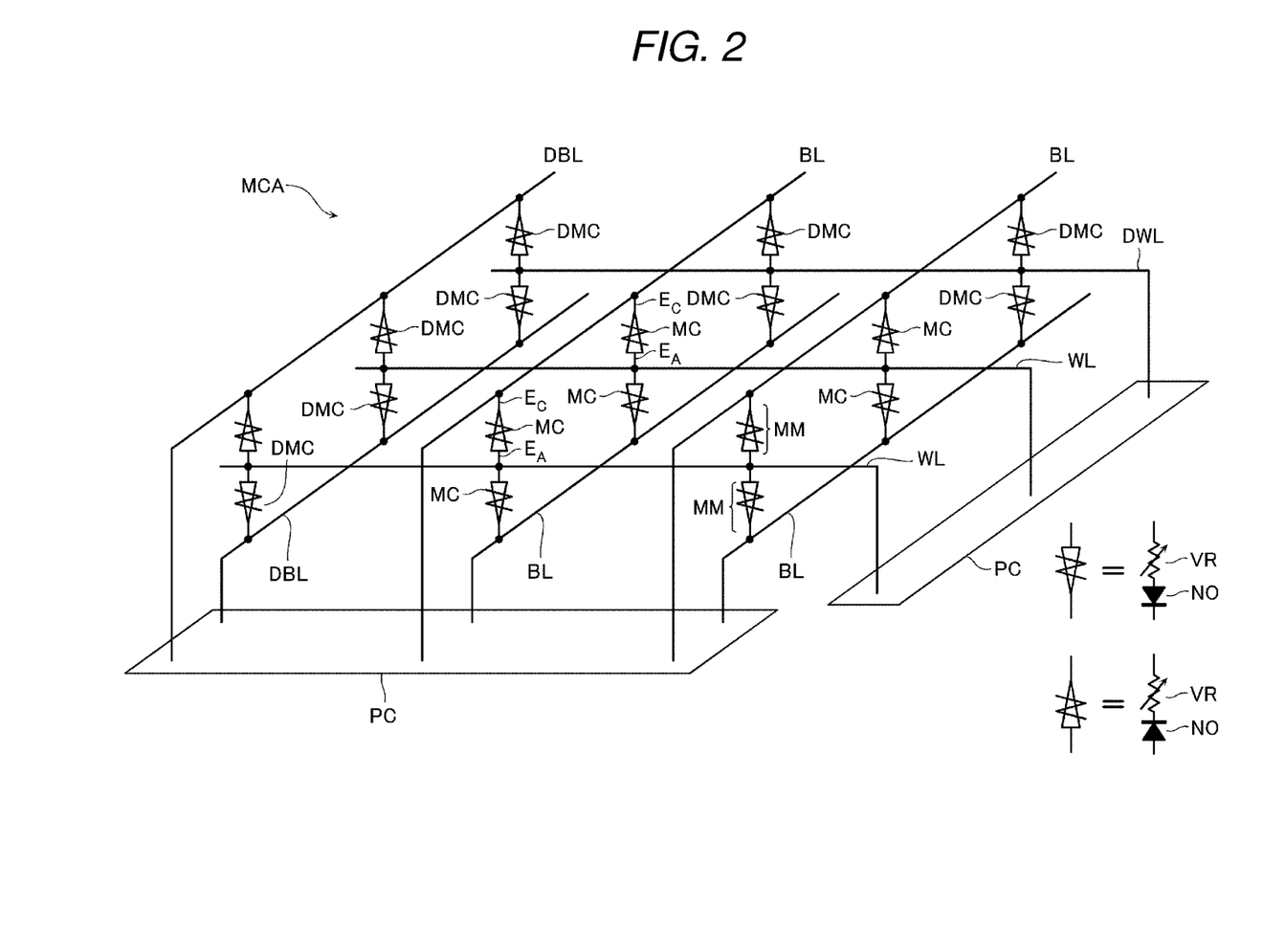
FIG. 2 is a schematic circuit diagram depicting aspects of a semiconductor storage device.

As depicted in FIG. 2, the memory cell array MCA includes a plurality of memory mats MM. The memory mats MM include a plurality of bit lines BL, a plurality of word lines WL, a plurality of memory cells MC at cross points of the bit lines BL and the word lines WL. In addition, at least one of the bit lines BL functions as a dummy bit line DBL, at least one of the word lines WL functions as a dummy word line DWL, and the memory cells MC connected to at least one of the dummy bit line DBL or the dummy word line DWL function as a dummy memory cell DMC. While FIG. 2 depicts a limited number of bit lines BL/DBL and word lines WL/DWL for the sake of simplification, in reality, each memory mat MM may include a larger number of bit lines BL/DBL and word lines WL/DWL. For example, each memory mat MM may include 64 bit lines BL (plus at least one dummy bit line DBL) and 64 word lines WL (plus at least one dummy word line DWL) for every layer of memory cells MC. A cathode $E_C$ of a memory cell MC is connected to a bit line BL. An anode $E_A$ of a memory cell MC is connected to a word line WL. The memory cell MC includes a resistance-variable element VR (see FIGS. 7A & 7B) and a nonlinear element NO (see FIGS. 7A & 7B). A dummy memory cell DMC has a configuration similar to the configuration of a memory cell MC excepting that a dummy memory cell DMC is connected to at least one of dummy word line DWL or a dummy bit line DBL.

As depicted in FIG. 1, the peripheral circuit PC includes a row decoder 12 connected to the word lines WL, a column decoder 13 connected to the bit lines BL, and a high-order block decoder 14 that supplies a row address and a column address to the row decoder 12 and the column decoder 13, respectively. The peripheral circuit PC includes a power supply circuit 15 that outputs voltages which are supplied to the bit lines BL, the dummy bit lines DBL, the word lines WL, and the dummy word lines DWL. A control circuit 16 included in the peripheral circuit PC controls the high-order block decoder 14 and the power supply circuit 15 with control signals or the like.

Figure 3:
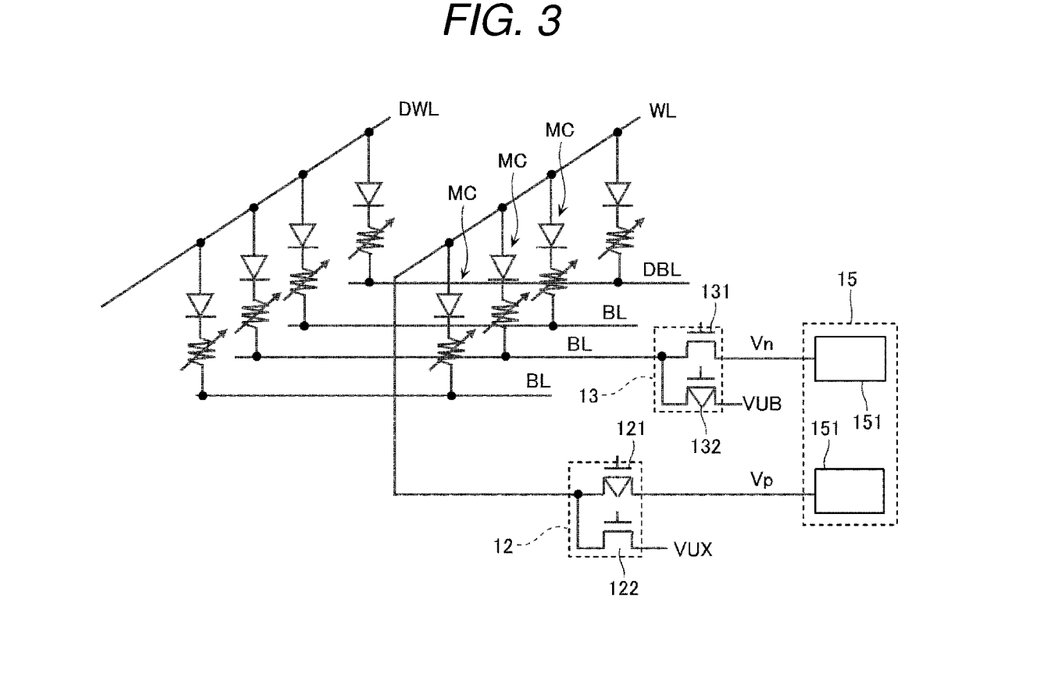
FIG. 3 is a schematic circuit diagram depicting aspects of a semiconductor storage device.

As depicted in FIG. 3, the row decoder 12 includes a P-type transistor 121 and an N-type transistor 122 which are connected to a word line WL. The row decoder 12 transfers a positive-polarity voltage Vp to a selected word line WL via the P-type transistor 121. The row decoder 12 transfers a voltage VUX to a non-selected word line WL via the N-type transistor 122. Though not depicted in the drawing, the row decoder 12 includes a plurality of P-type transistors 121 and a plurality of N-type transistors 122 corresponding to the plurality of word lines WL.

The column decoder 13 includes an N-type transistor 131 and a P-type transistor 132 which are connected to a bit line BL. The column decoder 13 transfers a negative-polarity voltage Vn to a selected bit line BL via the N-type transistor 131. The column decoder 13 transfers a voltage VUB to a non-selected bit line BL via the P-type transistor 132. Though not depicted in the drawing, the column decoder 13 includes a plurality of N-type transistors 131 and a plurality of P-type transistors 132 corresponding to the plurality of bit lines BL.

As depicted in FIG. 1, the power supply circuit 15 supplies, via the row decoder 12, the positive-polarity voltage Vp to the selected word line WL and the voltage VUX to the non-selected word line WL. The power supply circuit 15 also supplies, via the column decoder 13, the negative-polarity voltage Vn to the selected bit line BL and the voltage VUB to the non-selected bit line BL. Furthermore, the power supply circuit 15 supplies a negative-polarity voltage VDWL and a positive-polarity voltage VDBL to the dummy word line DWL and the dummy bit line DBL, respectively. The power supply circuit 15 includes, for example, a plurality of bias circuits 151 that output these voltages.

Figure 4:
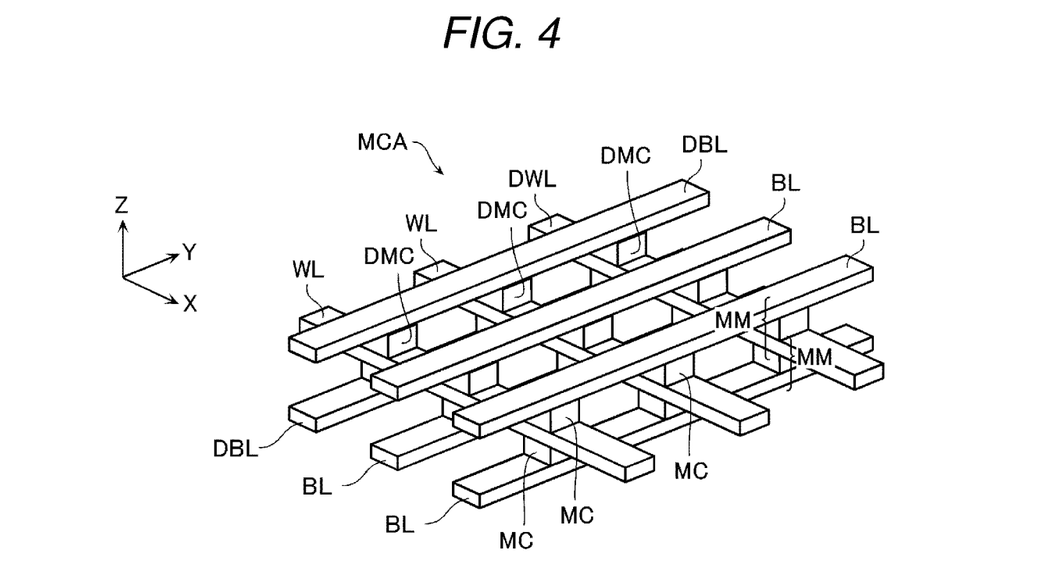
FIG. 4 is a perspective view depicting aspects of a semiconductor storage device.
Figure 5:
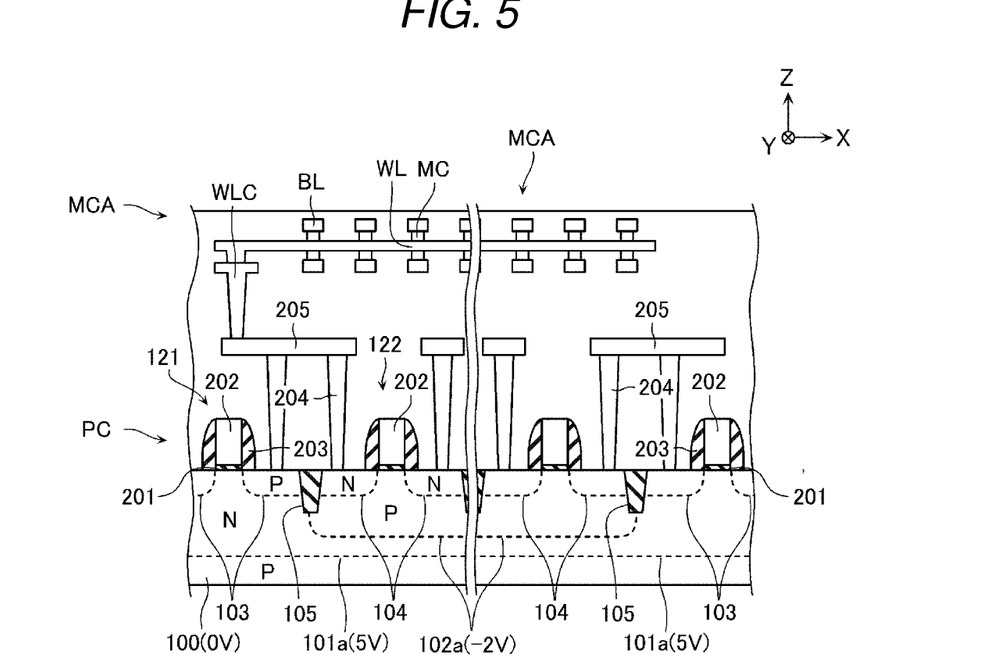
FIG. 5 is a cross-sectional view depicting aspects of a semiconductor storage device.
Figure 6:
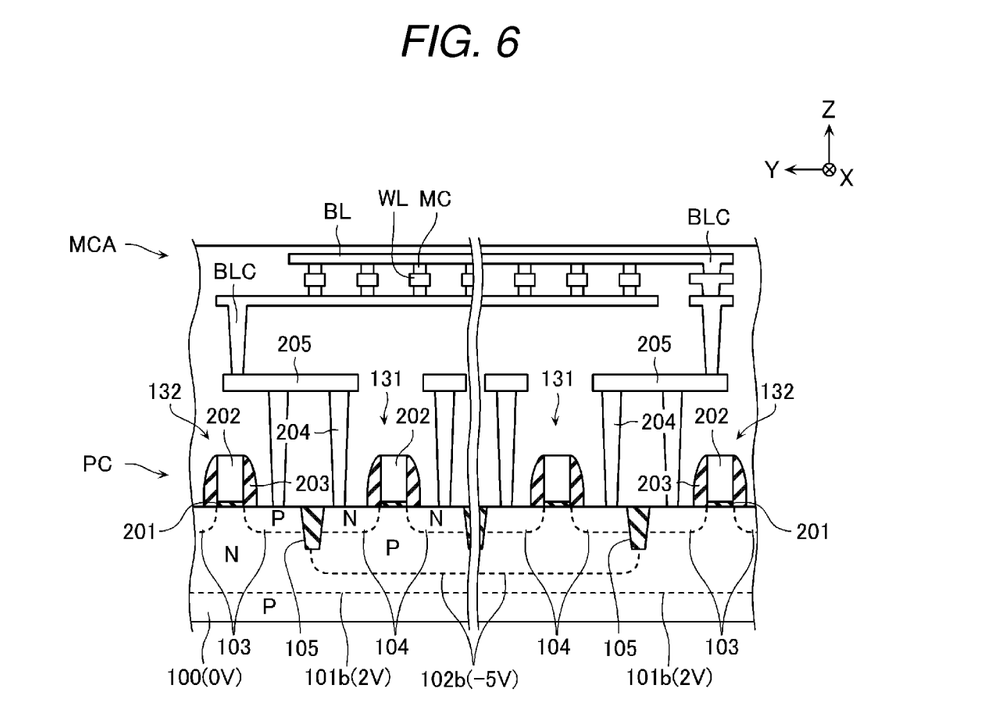
FIG. 6 is a cross-sectional view depicting aspects of a semiconductor storage device.

FIG. 4 is a schematic perspective view depicting a part of the semiconductor storage device according to the first embodiment. FIG. 5 is a schematic XZ cross-sectional view depicting a part of the semiconductor storage device. FIG. 6 is a schematic YZ cross-sectional view depicting a part of the semiconductor storage device.

As depicted in FIG. 4, the memory cell array MCA according to the first embodiment includes a plurality of memory mats MM. Each memory mat MM may include a plurality of layers of memory cells MC and dummy memory cells DMC arranged in the Z direction. The memory mats MM include a plurality of bit lines BL and at least one dummy bit line DBL that are arranged in the X direction and extend in the Y direction, a plurality of word lines WL and at least one dummy word line DWL that are arranged in the Y direction and extend in the X direction, and a plurality of memory cells MC and dummy memory cells DMC that are arranged in the X direction and the Y direction at cross points of the bit lines BL (and the dummy bit line DBL) and the word lines WL (and the dummy word line DWL) when viewed in the Z direction. As depicted in FIG. 4, two memory mats MM arranged in the Z direction may have a common bit line BL and a common dummy bit line DBL or a common word line WL and a common dummy word line DWL.

As depicted in FIG. 5, the peripheral circuit PC according to the first embodiment includes a field-effect transistor formed on a semiconductor substrate 100.

The semiconductor substrate 100 is, for instance, a semiconductor substrate made of single-crystal silicon (Si) or the like containing P-type impurities such as boron (B). A voltage of about 0 V, for example, is supplied to the semiconductor substrate 100 at the time of operation.

The P-type transistors 121 (FIG. 3) are also provided on the upper surface of the semiconductor substrate 100. For example, on the upper surface of the semiconductor substrate 100, an N-type well 101a containing N-type impurities such as phosphorus (P) is provided. On the upper surface of the N-type well 101a, a gate insulating film 201, a gate electrode 202, and a side wall insulating film 203 are provided. The side wall insulating film 201 is provided on the side walls of the gate insulating film 201 and the gate electrode 202. In the N-type well 101a, P-type semiconductor regions 103 containing P-type impurities such as boron are provided. Each of these P-type semiconductor regions 103 is connected to the word line WL or the power supply circuit 15 (FIG. 3) via a contact 204, an interconnection 205, a word line contact WLC, and the like. A voltage of about 5 V, for example, is supplied to the N-type well 101a.

Furthermore, the N-type transistors 122 (FIG. 3) are provided on the front surface of the semiconductor substrate 100. For example, on the front surface of the N-type well 101a, a P-type well 102a containing P-type impurities such as boron is provided. On the front surface of the P-type well 102a, the gate insulating film 201, the gate electrode 202, and the side wall insulating film 203 provided on the side walls of the gate insulating film 201 and the gate electrode 202 are provided. In the P-type well 102a, N-type semiconductor regions 104 containing N-type impurities such as phosphorus are provided. Each of these N-type semiconductor regions 104 is connected to the word line WL or the power supply circuit 15 (FIG. 3) via the contact 204, the interconnection 205, the word line contact WLC, and the like. A voltage of about −2 V, for example, is supplied to the P-type well 102a.

As depicted in FIG. 6, the P-type transistors 132 (FIG. 3) are provided on the front surface of the semiconductor substrate 100. For instance, on the front surface of the semiconductor substrate 100, an N-type well 101b containing N-type impurities such as phosphorus is provided. On the front surface of the N-type well 101b, the gate insulating film 201, the gate electrode 202, and the side wall insulating film 203 provided on the side walls of the gate insulating film 201 and the gate electrode 202 are provided. Furthermore, in the N-type well 101b, the P-type semiconductor regions 103 containing P-type impurities such as boron are provided. Each of these P-type semiconductor regions 103 is connected to the bit line BL or the power supply circuit 15 (FIG. 3) via the contact 204, the interconnection 205, a bit line contact BLC, and the like. A voltage of about 2V, for example, is supplied to the N-type well 101b.

In addition, the N-type transistors 131 (FIG. 3) are provided on the front surface of the semiconductor substrate 100. For instance, on the front surface of the N-type well 101b, a P-type well 102b containing P-type impurities such as boron is provided. On the front surface of the P-type well 102b, the gate insulating film 201, the gate electrode 202, and the side wall insulating film 203 provided on the side walls of the gate insulating film 201 and the gate electrode 202 are provided. In the P-type well 102b, the N-type semiconductor regions 104 containing N-type impurities such as phosphorus are provided. Each of these N-type semiconductor regions 104 is connected to the bit line BL or the power supply circuit 15 (FIG. 3) via the contact 204, the interconnection 205, the bit line contact BLC, and the like. A voltage of about −5 V, for example, is supplied to the P-type well 102b at the time of operation.

Figure 7A:
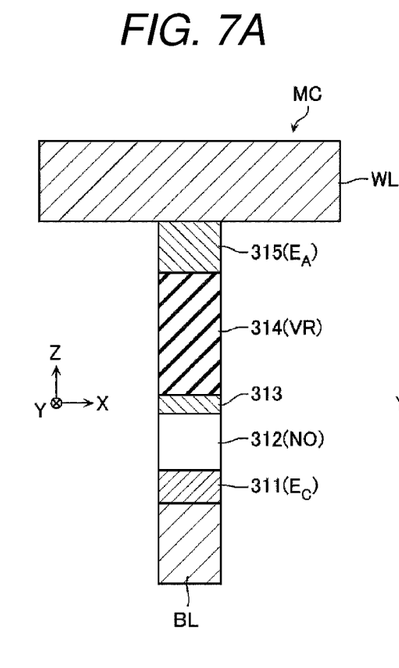
FIGS. 7A and 7B are cross-sectional views of a memory cell.
Figure 7B:
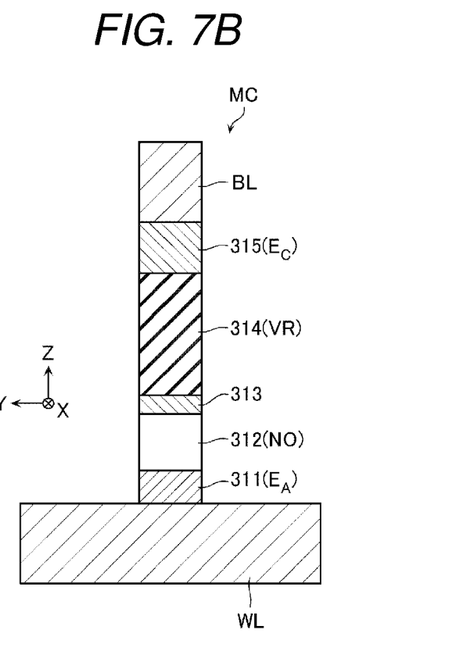

FIGS. 7A and 7B are schematic sectional views of the memory cell MC according to the present embodiment. FIG. 7A corresponds to the memory cell MC below which the bit line BL is provided and above which the word line WL is provided. FIG. 7B corresponds to the memory cell MC below which the word line WL is provided and above which the bit line BL is provided.

As depicted in FIGS. 7A and 7B, the memory cell MC according to the present embodiment includes a conductive layer 311, a chalcogen layer 312, a conductive layer 313, a chalcogen layer 314, and a conductive layer 315 which are stacked in order in the Z direction.

The conductive layer 311 is connected to the bit line BL or the word line WL, which is provided immediately below the memory cell MC, and functions as the cathode $E_C$ or the anode $E_A$ of the memory cell MC. The conductive layer 311 may be, for example, a stacked film or the like of titanium nitride (TiN) and tungsten (W), polycrystal silicon or the like containing N-type impurities, such as phosphorus (P), implanted thereinto, or other conductive layers such as carbon (C), carbon nitride (CN), tungsten carbide (WC), tungsten carbonitride (WCN), and tungsten carbonitride silicide (WCNSi).

The chalcogen layer 312 functions as the nonlinear element NO. For instance, when a voltage which is lower than a predetermined threshold voltage is applied to the chalcogen layer 312, the chalcogen layer 312 is in a high resistance state. When the voltage which is applied to the chalcogen layer 312 reaches the predetermined threshold voltage, the chalcogen layer 312 enters a low resistance state and the current flowing through the chalcogen layer 312 increases by one or more orders of magnitude. When the voltage which is applied to the chalcogen layer 312 falls below a predetermined voltage, the chalcogen layer 312 enters the high resistance state again.

The chalcogen layer 312 contains, for example, at least one or more types of chalcogens. The chalcogen layer 312 may contain, for instance, a chalcogenide which is a compound containing a chalcogen. Moreover, the chalcogen layer 312 may comprise at least one element selected from a group composed of B, Al, Ga, In, C, Si, Ge, Sn, As, P, and Sb.

"Chalcogen" here refers to any element, other than oxygen (O, which belongs to Group 16 of the periodic table. Chalcogens include, for example, sulfur (S), selenium (Se), tellurium (Te), and the like.

The conductive layer 313 functions as an electrode that connects the nonlinear element NO and the resistance-variable element VR. The conductive layer 313 may contain a material similar to the material of the conductive layer 311, for instance.

The chalcogen layer 314 functions as the resistance-variable element VR. The chalcogen layer 314 enters an amorphous state (a reset state: a high resistance state) by heating that is performed at a melting temperature or above and rapid cooling. The chalcogen layer 314 enters a crystalline state (a set state: a low resistance state) by heating that is performed at a temperature lower than the melting temperature but higher than a crystallization temperature followed by gradual cooling.

The chalcogen layer 314 contains, for example, at least one or more chalcogens. The chalcogen layer 314 may contain, for instance, a chalcogenide which is a compound containing a chalcogen. The chalcogen layer 314 may be, for example, GeSbTe, GeTe, SbTe, SiTe, or the like. The chalcogen layer 314 may comprise at least one of element selected from germanium (Ge), antimony (Sb), and tellurium (Te).

The conductive layer 315 is connected to the one of a word line WL or a bit line BL, which is directly above the respective memory cell MC. The conductive layer 315 functions as the anode $E_A$ or the cathode $E_C$ of the memory cell MC depending on whether it is connected to a word line WL ($E_A$) or a bit line BL ($E_C$). The conductive layer 315 may contain a material similar to the material of the conductive layer 311, for instance.

In FIGS. 7A and 7B, the configuration of memory cells MC is depicted. The dummy memory cells DMC also have configurations similar to the configurations of the memory cells MC.

Figure 8:
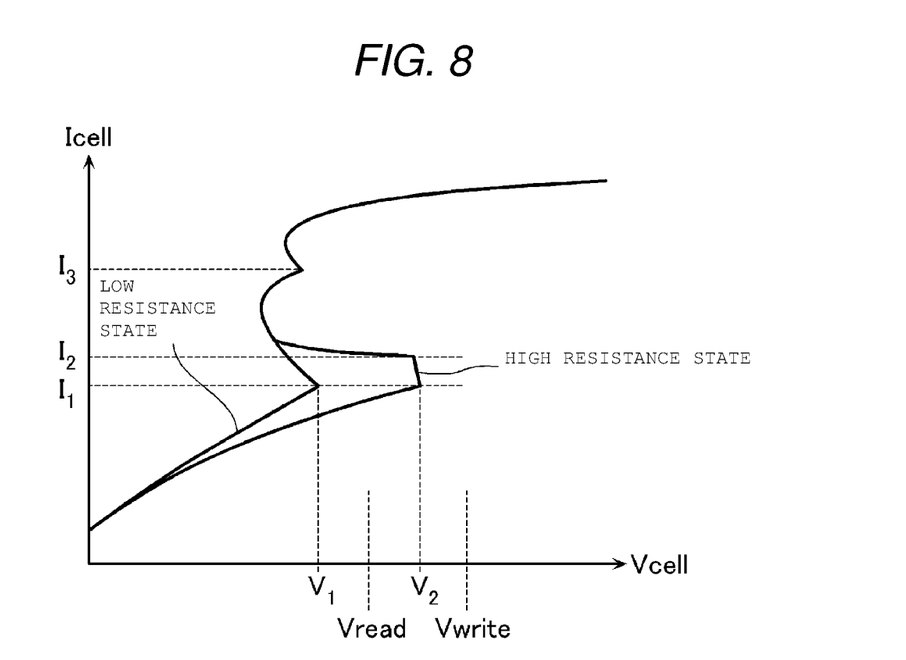
FIG. 8 is a graph depicting current-voltage characteristics of a memory cell.

FIG. 8 is a graph showing the current-voltage characteristics of the memory cell MC according to the present embodiment. The horizontal axis represents a cell voltage Vcell, which is a voltage difference between the cathode $E_C$ and the anode $E_A$ of the memory cell MC. The vertical axis represents, on a logarithmic axis scale, a cell current Icell which flows through the memory cell MC.

When the cell current Icell is less than a current value $I_1$, the cell voltage Vcell monotonously increases with an increase in the cell current Icell. When the cell current Icell reaches the current value $I_1$, the cell voltage Vcell of a memory cell MC in the low resistance state reaches a voltage $V_1$. The cell voltage Vcell of a memory cell MC in the high resistance state reaches a voltage $V_2$. The voltage $V_2$ is higher than the voltage $V_1$.

When cell current Icell is larger than the current value $I_1$ but smaller than a current value $I_2$, the cell voltage Vcell monotonously decreases with an increase in the cell current Icell. In this range, the cell voltage Vcell of a memory cell MC in the high resistance state is higher than the cell voltage Vcell of a memory cell MC in the low resistance state.

When the cell current Icell is larger than the current value $I_2$ but smaller than a current value $I_3$, the cell voltage Vcell initially decreases with an increase in the cell current Icell from current value $I_2$ and then the cell voltage Vcell begins to increase as the cell current Icell approaches the current value $I_3$. In this range, the cell voltage Vcell of a memory cell MC in the high resistance state quickly decreases with the initial increase in the cell current Icell to become substantially equal to the cell voltage Vcell of a memory cell MC in the low resistance state.

When cell current Icell is larger than the current value $I_3$, the cell voltage Vcell initially decreases with an increase in the cell current Icell from current value $I_3$ and then begins to increase monotonically with increases in cell current Icell. The behavior is substantially the same for memory cells MC in either of the high or low resistance states.

From this state, if the cell current Icell is rapidly reduced to a magnitude which is smaller than the current value $I_1$, the chalcogen layer 314 enters the high resistance state. However, if the cell current Icell is gradually decreased to a magnitude which is smaller than the current value $I_1$ over a certain period of time or longer, the chalcogen layer 314 enters the low resistance state.

[Operation]

At the time of a read operation, the cell voltage Vcell is set at a read voltage Vread, which is higher than the voltage $V_1$ but lower than the voltage $V_2$ and detection is performed to determine whether or not the cell current Icell is larger than some threshold current. The threshold current may be set so as to be larger than or equal to the current value $I_1$, for example.

At the time of a write operation, first, the cell voltage Vcell is adjusted to a write voltage Vwrite, which is higher than the voltage $V_2$. Next, if the memory cell MC is to be placed in the high resistance state, the cell voltage Vcell is decreased to 0 V rapidly within some predetermined amount of time. On the other hand, if the memory cell MC is to be placed in the low resistance state, the cell voltage Vcell is gradually reduced to 0 V over some predetermined period of time or longer.

Figure 9:
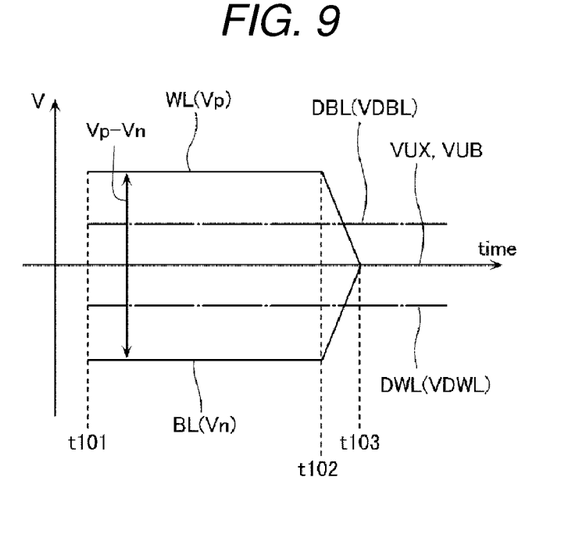
FIG. 9 is a graph for illustrating aspects of a write operation or a read operation.

FIG. 9 is a schematic waveform diagram illustrating the voltages which are supplied to the word line WL, the dummy word line DWL, the bit line BL, and the dummy bit line DBL in the read operation or the write operation.

In the example depicted in FIG. 9, from time t101 to time t102, the positive-polarity voltage Vp is supplied to the selected word line WL and the negative-polarity voltage Vn is supplied to the selected bit line BL. When the read operation is executed, the magnitudes of the voltage Vp and the voltage Vn are adjusted so that the difference Vp−Vn is the read voltage Vread (FIG. 8). When the write operation is executed, the magnitudes of the voltage Vp and the voltage Vn are adjusted so that the difference Vp−Vn is the write voltage Vwrite (FIG. 8). The voltage Vp and the voltage Vn may have nearly equal magnitudes or may be identical in magnitude, for example.

In the example depicted in FIG. 9, from time t101 to time t102, the voltage VUX is supplied to the non-selected word line WL and the voltage VUB is supplied to the non-selected bit line BL. The voltage VUX and the voltage VUB may be about 0 V, for example. Furthermore, the negative-polarity voltage VDWL is supplied to the dummy word line DWL and the positive-polarity voltage VDBL is supplied to the dummy bit line DBL.

Furthermore, in the example depicted in FIG. 9, from time t102 to time t103, the magnitudes of the voltages on the word line WL and the bit line BL are adjusted towards 0 V. If the memory cell MC needs to be brought to the high resistance state in a write operation, the time period from time t102 to time t103 is set to be relatively short (a rapid change). On the other hand, if the memory cell MC needs to be brought to the low resistance state, the time period from time t102 to time t103 is set to be relatively long (a gradual change).

In the example depicted in FIG. 9, from time t102 to time t103, the voltage of the non-selected word line WL is maintained at the voltage VUX, the voltage of the non-selected bit line BL is maintained at the voltage VUB, the voltage of the dummy word line DWL is maintained at the voltage VDWL, and the voltage of the dummy bit line DBL is maintained at the voltage VDBL.

[Effects]

As described with reference to FIG. 9, in the semiconductor storage device according to the present embodiment, the positive-polarity voltage Vp is supplied to the selected word line WL and the negative-polarity voltage Vn is supplied to the selected bit line BL. Compared to a case in which a negative-polarity voltage is not used, the semiconductor storage device can be operated with voltages of small absolute magnitudes and power consumption can be reduced. Moreover, as the respective transistor are not necessary to be of a high breakdown voltage type/design and thus are not necessarily of a large size, device die shrinkage can be achieved.

Moreover, as described with reference to FIG. 5, in the semiconductor storage device according to the present embodiment, the voltage of the N-type well 101*a* is set at a magnitude of about 5 V during operations and the voltage of the P-type well 102*a* is set at a magnitude of about −2 V during operations. In this mode, a reverse bias is supplied between the N-type well 101*a* and the P-type well 102*a*. Furthermore, if the voltage on the word lines WL is a voltage higher than −2 V, a reverse bias is also supplied between each N-type semiconductor region 104 and the P-type well 102*a*. In addition, if the voltage on the word lines WL is a voltage lower than 5 V, a reverse bias is also supplied between each P-type semiconductor region 103 and the N-type well 101*a*.

Figure 10:
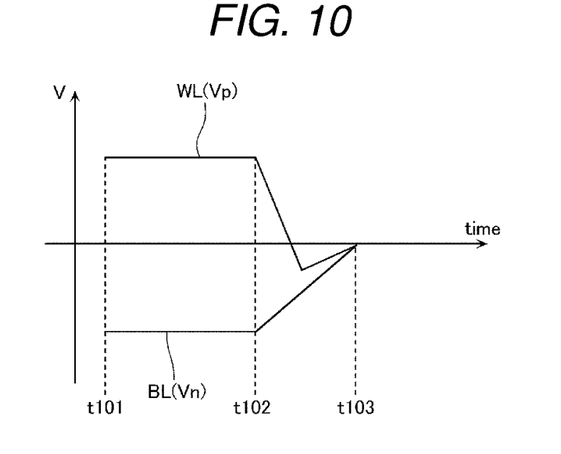
FIG. 10 is a graph for illustrating aspects of a write operation or a read operation.

In the present embodiment, the magnitudes of the voltages on the word line WL and the bit line BL are sometimes gradually decreased to 0 V in the period from time t102 to time t103. In this case, if a rate at which the magnitude of the voltage on the word line WL is decreased is higher than a rate at which the magnitude of the voltage on the bit line BL is decreased, as illustrated in FIG. 10, the voltage on the word line WL may become a negative voltage during the period from time t102 to time t103. If the voltage on the word line WL becomes a voltage lower than −2 V, a forward bias is supplied between each N-type semiconductor region 104 (FIG. 5) and the P-type well 102*a* (FIG. 5) and a large amount of current flows into the N-type semiconductor regions 104 from the P-type well 102a, which may cause damage to the transistor, for example.

A similar phenomenon can also occur if the voltage on the bit line BL becomes a voltage higher than 2 V.

Figure 11:
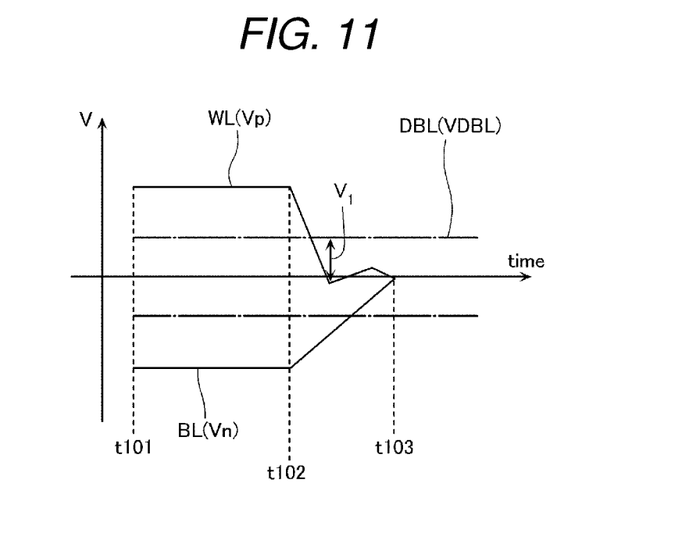
FIG. 11 is a graph for illustrating aspects of a write operation or a read operation.
Figure 12:
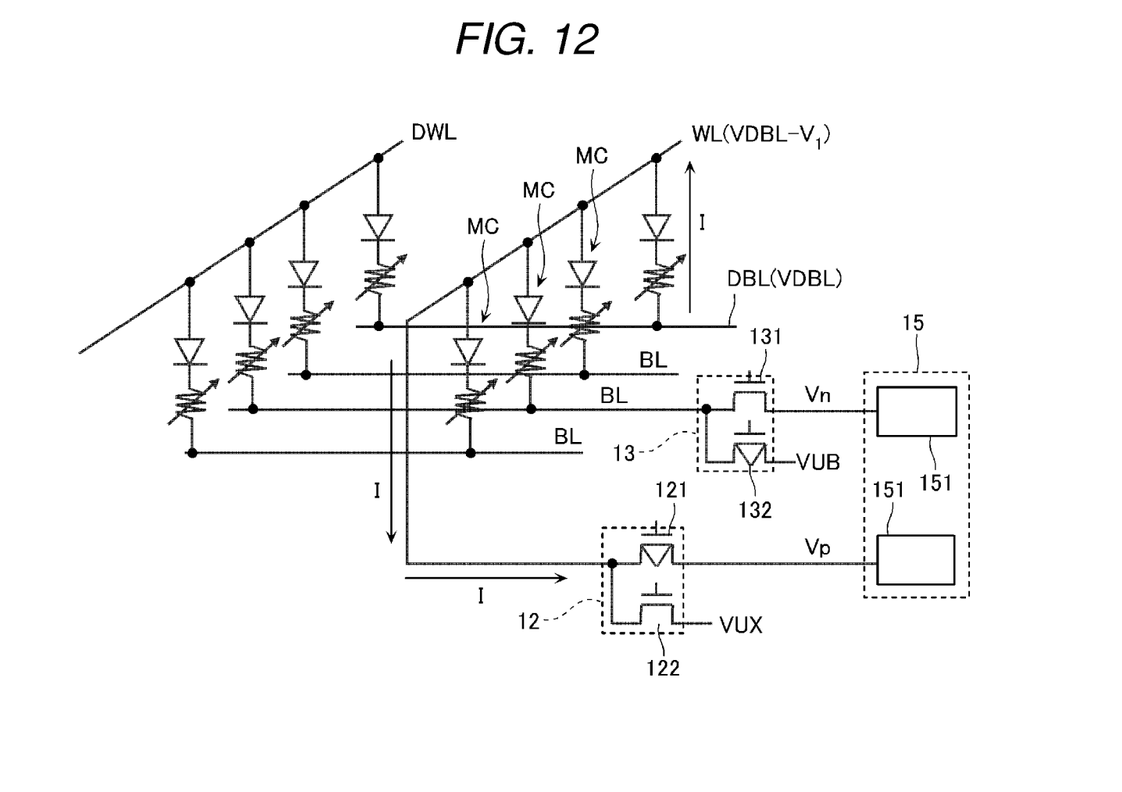
FIG. 12 is a schematic circuit diagram for explaining aspects of a write operation or a read operation.

For this reason, in the present embodiment, as described with reference to FIG. 9, from time t102 to time t103, the negative-polarity voltage VDWL is supplied to the dummy word line DWL and the positive-polarity voltage VDBL is supplied to the dummy bit line DBL. In this mode, as depicted in FIG. 11, when the voltage of the selected word line WL decreases, the voltage difference between the selected word line WL and the dummy bit line DBL reaches the voltage $V_1$ (FIG. 8) or the voltage $V_2$ (FIG. 8). As a result, a current I (see FIG. 12) suddenly flows through the dummy memory cell DMC connected to the selected word line WL and the dummy bit line DBL, whereby the selected word line WL is charged (see FIGS. 11 and 12). As a result, a forward bias can be prevented from being supplied between each N-type semiconductor region 104 (FIG. 5) and the P-type well 102a (see FIG. 11).

Likewise for the bit line BL, a forward bias can be prevented from being applied between each P-type semiconductor region 103 (FIG. 6) and the N-type well 101b (FIG. 6) by supplying the negative-polarity voltage VDWL to the dummy word line DWL.

[The voltages on the dummy bit line DBL and the dummy word line DWL]

The voltage VDBL on the dummy bit line DBL may be adjusted as appropriate. For instance, in the first embodiment, a voltage of about −2 V is supplied to the P-type well 102a (FIG. 5). Here, if the voltage which is supplied to the P-type well 102a is assumed to be a voltage Vb_ux, the voltage VDBL of the dummy bit line DBL is desirably a voltage Vb_ux+$V_2$ or higher. Since voltage $V_2$ (FIG. 8) is higher than the read voltage Vread, the voltage VDBL on the dummy bit line DBL is desirably a voltage higher than at least a voltage Vb_ux+Vread.

Likewise, the voltage VDWL on the dummy word line DWL may also be adjusted as appropriate. For example, if the voltage which is supplied to the N-type well 101b is assumed to be a voltage Vb_ub, the voltage VDWL on the dummy word line DWL is desirably a voltage Vb_ub−$V_2$ or lower. Since voltage $V_2$ (FIG. 8) is higher than the read voltage Vread, the voltage VDWL on the dummy word line DWL is desirably a voltage lower than at least a voltage Vb_ub−Vread.

Other Embodiments

In the first embodiment, the chalcogen layer 314 comprising a chalcogen is used as the resistance-variable element VR in the memory cell MC. However, other resistance-variable elements VR types may also be used in the memory cell MC. For instance, the resistance-variable element VR may be a magnetoresistive layer including a magnetization free layer, a magnetization fixed layer, and a tunnel insulating film, such as magnesium oxide (MgO), which is provided between the magnetization free layer and the magnetization fixed layer. In other examples, the resistance-variable element VR may be a layer that includes an insulating layer such as a metal oxide in which a filament such as a metal ion or an oxygen defect can be generated.

In general, the resistance-variable element VR can be any component that can enter a high resistance state or a low resistance state by the application of a voltage in a write operation to permit the subsequent performance of a read operation to detect the particular resistance state.

In the first embodiment, a nonlinear element NO containing a chalcogen was described as an example. However, other types of nonlinear elements NO may be used instead. Furthermore, the resistance-variable element VR may itself function as the nonlinear element NO in some examples.

In addition, in the first embodiment, as described with reference to FIG. 9, the voltage VDWL is supplied to the dummy word line DWL and the voltage VDBL is supplied to the dummy bit line DBL from time t101 to time t103 of the write operation or the read operation. However, to prevent the above-described supplying of a forward bias, the voltage VDWL and the voltage VDBL only have to be supplied at time at which the polarity of the voltage of the selected word line WL or the selected bit line BL may be reversed. Thus, time at which the voltage VDWL is supplied to the dummy word line DWL and the voltage VDBL is supplied to the dummy bit line DBL may begin at time t102 or at some time between time t102 and time t103.

[Others]

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor storage device, comprising:
   a first plurality of interconnections in a first layer;
   a second plurality of interconnections in a second layer;
   a first plurality of memory cells connected between the first and second pluralities of interconnections and including:
      a first memory cell with a first variable resistance element connected to a first interconnection in the first plurality and a first nonlinear element, the first nonlinear element being connected to a second interconnection in the second plurality;
      a dummy memory cell with a second variable resistance element connected to the first interconnection and a second nonlinear element, the second nonlinear element being connected to a third interconnection in the second plurality; and
   a controller configured to:
      apply a first voltage of a first polarity to the first interconnection and a second voltage of a second polarity opposite the first polarity to the second interconnection at a first time point during a reading or writing operation on the plurality of memory cells,
      apply a third voltage at a second time point after the first time point during the reading or writing operation to the first interconnection, the third voltage having a magnitude smaller than a magnitude of the first voltage, and
      apply a fourth voltage to the third interconnection at the second time point during the reading or writing operation, the fourth voltage having a magnitude that is larger than the magnitude of the third voltage but smaller than the magnitude of the first voltage.

2. The semiconductor storage device according to claim 1, wherein the controller is further configured to begin applying the fourth voltage to the third interconnection starting at the first time point during the reading or writing operation.

3. The semiconductor storage device according to claim 1, wherein
each interconnection of the first plurality extends in a first direction,
the interconnections of the first plurality are spaced from each other in a second direction,
each interconnection of the second plurality extends in the second direction, and
the interconnections of the second plurality are spaced from each other in the first direction.

4. The semiconductor storage device according to claim 3, wherein the third interconnection is an outermost interconnection of the second plurality in the first direction.

5. The semiconductor storage device according to claim 3, wherein
the first and second layers are spaced from each other in a third direction orthogonal to the first and second directions, and
the first plurality of memory cells is between the first and second layers in the third direction.

6. The semiconductor storage device according to claim 1, wherein each memory cell comprises a chalcogen layer.

7. The semiconductor storage device according to claim 1, wherein the controller is a peripheral circuit including a row decoder, a column decoder, a power supply unit, and a control circuit.

8. The semiconductor storage device according to claim 1, wherein
the controller includes a first field effect transistor of a first conductivity type connected to the first interconnection and a second field effect transistor of a second conductivity type connected to the first interconnection, and
the controller applies the first and second voltages to the first interconnection during the reading or writing operation by switching conduction states of the first and second field effect transistors.

9. The semiconductor storage device according to claim 1, further comprising:
a third plurality of interconnections in a third layer; and
a second plurality of memory cells connected between the second and third plurality of interconnections and including:
a second memory cell with a third variable resistance element connected to the second interconnection and a third nonlinear element, the third nonlinear element being connected to a fourth interconnection in the third plurality.

10. The semiconductor storage device according to claim 1, further comprising:
a third plurality of interconnections in a third layer; and
a second plurality of memory cells connected between the second and third plurality of interconnections and including:
a second dummy memory cell with a third variable resistance element connected to the second interconnection and a third nonlinear element, the third nonlinear element being connected to a fourth interconnection in the third plurality, wherein
the controller is further configured to apply a fifth voltage to the fourth interconnection at the second time point during the reading or writing operation, the fifth voltage having a magnitude that is larger than the magnitude of the third voltage.

11. The semiconductor storage device according to claim 10, wherein the fourth and fifth voltages have the same magnitude as each other but opposite polarities from each other.

12. A semiconductor storage device, comprising:
a first plurality of interconnections in a first layer;
a second plurality of interconnections in a second layer;
a first plurality of memory cells connected between the first and second pluralities of interconnections and including:
a first memory cell with a first variable resistance element connected to a first interconnection in the first plurality and a first nonlinear element, the first nonlinear element being connected to a second interconnection in the second plurality;
a dummy memory cell with a second variable resistance element connected to the first interconnection and a second nonlinear element, the second nonlinear element being connected to a third interconnection in the second plurality; and
a controller including:
a first voltage supply circuit connected to the first interconnection via a first transistor and a second transistor;
a second voltage supply circuit connected to the second interconnection via a third transistor and a fourth transistor; and
a third voltage supply circuit connected to the third interconnection, wherein
the controller is configured to:
control the first voltage supply circuit to apply a first voltage of a first polarity to the first interconnection via the first transistor at a first time point during a reading or writing operation on the plurality of memory cells,
control the second voltage supply circuit to apply a second voltage of a second polarity opposite the first polarity to the second interconnection via the third transistor at the first time point,
control the first voltage supply circuit to apply a third voltage to the first interconnection at a second time point after the first time point during the reading or writing operation via the second transistor, the third voltage having a magnitude smaller than a magnitude of the first voltage,
control the second voltage supply circuit to apply a fourth voltage to the second interconnection at the second time point via the fourth transistor, the fourth voltage having a magnitude smaller than the magnitude of the second voltage, and
control the third voltage supply circuit to apply a fifth voltage to the third interconnection at the second time point, the fifth voltage having a magnitude that is larger than the magnitude of the third voltage but smaller than the magnitude of the first voltage.

13. The semiconductor storage device according to claim 12, wherein each memory cell comprises a chalcogen layer.

14. The semiconductor storage device according to claim 12, wherein the controller is further configured to begin applying the fifth voltage to the third interconnection starting at the first time point during the reading or writing operation.

15. The semiconductor storage device according to claim 12, wherein
each interconnection of the first plurality extends in a first direction,
the interconnections of the first plurality are spaced from each other in a second direction, each interconnection of the second plurality extends in the second direction, and the interconnections of the second plurality are spaced from each other in the first direction.

16. The semiconductor storage device according to claim 15, wherein the third interconnection is an outermost interconnection of the second plurality in the first direction.

17. A semiconductor storage device, comprising:

a first bit line extending in a first direction;

a first word line extending in a second direction crossing the first direction;

a dummy bit line extending in the first direction and spaced from the first bit line in the second direction a first memory cell between the first bit line and the first word line in a third direction orthogonal to the first and second direction;

a dummy memory cell between the dummy bit line and the first word line in the third direction; and a controller configured to:

apply a first voltage of a first polarity to the first bit line and a second voltage of a second polarity opposite the first polarity to the first word line at a first time point during a reading or writing operation on the memory cell, apply a third voltage at a second time point after the first time point during the reading or writing operation to the first bit line, the third voltage having a magnitude smaller than a magnitude of the first voltage, and apply a fourth voltage of the first polarity to the dummy bit line at or before the second time point during the reading or writing operation, the fourth voltage having a magnitude that is larger than the magnitude of the third voltage but smaller than the magnitude of the first voltage.

18. The semiconductor storage device according to claim 17, wherein the first memory cell comprises a variable resistance element connected in series with a nonlinear element.

19. The semiconductor storage device according to claim 17, wherein the controller is a peripheral circuit including a row decoder, a column decoder, a power supply unit, and a control circuit.

* * * * *